United States Patent [19]

Rostoker et al.

[11] Patent Number: 5,264,729
[45] Date of Patent: Nov. 23, 1993

[54] SEMICONDUCTOR PACKAGE HAVING PROGRAMMABLE INTERCONNECT

[75] Inventors: Michael D. Rostoker, San Jose; Yin Chang, Berkeley, both of Calif.

[73] Assignee: LSI Logic Corporation, Milpitas, Calif.

[21] Appl. No.: 921,806

[22] Filed: Jul. 29, 1992

[51] Int. Cl.$^5$ .................... H01L 23/48; H01L 29/40
[52] U.S. Cl. .................... 257/774; 257/529; 257/693; 257/700; 361/772; 361/778; 361/820
[58] Field of Search ............... 257/529, 530, 700, 774, 257/693; 361/395, 397, 404, 406, 409, 410

[56] References Cited

U.S. PATENT DOCUMENTS

| | | | |
|---|---|---|---|
| 3,959,579 | 5/1976 | Johnson | 257/774 |
| 4,322,778 | 3/1982 | Barbour et al. | 257/700 |
| 4,617,730 | 10/1986 | Geldermans | 257/774 |
| 4,894,708 | 1/1990 | Watari | 257/700 |
| 4,943,845 | 7/1990 | Wilby | 257/700 |

FOREIGN PATENT DOCUMENTS

| | | | |
|---|---|---|---|
| 0419836 | 4/1991 | European Pat. Off. | 257/700 |
| 0178752 | 10/1984 | Japan | 257/700 |
| 0025437 | 2/1987 | Japan | 257/700 |

*Primary Examiner*—William Mintel
*Assistant Examiner*—David Ostrowski
*Attorney, Agent, or Firm*—Gerald E. Linden

[57] ABSTRACT

A semiconductor package is described which has external connection points (pins, pads, etc.) which may be configured from outside of the package. In one embodiment, this is accomplished with programming holes which pass through and form contact surfaces with various conductors within the package. Conductive material is then deposited into selected holes, forming connections between all of the contact surfaces in any hole. In another embodiment, configurability is accomplished via conductive pads disposed on the exterior surface of the package. Conductive jumpers are then used to connect selected pads. An auxiliary externally effected power plane and bus-bar structure are also described.

12 Claims, 3 Drawing Sheets

SEMICONDUCTOR PACKAGE HAVING PROGRAMMABLE INTERCONNECT

TECHNICAL FIELD OF THE INVENTION

This invention relates to semiconductor devices, and more particularly to packages for semi-custom integrated circuits.

BACKGROUND OF THE INVENTION

Recent advances in semiconductor processing have made possible the sale and manufacture of "semi-custom" integrated circuits, particularly ASICs (Application Specific Integrated Circuits) based on gate arrays and standard cell designs. These ASICs are generally produced in relatively low volumes according to a user's specification which makes use of a manufacturer's standard cell or gate array building blocks. ASICs offer the user a relatively quick, cost-effective approach to meeting the needs of a rapidly changing electronics marketplace.

ASICs have grown sufficiently in complexity, however, that 10,000 gate designs are commonplace, and 100,000 gate ASICs are not unheard of. Along with this complexity has come a need for more sophisticated semiconductor packages. These high-gate-count ASICs often require hundreds of pins, and can have very demanding power supply pin requirements. These requirement have been dealt with in the prior art, but usually by providing some form of a custom designed package.

Custom-designed packages often make use of multi-layer ceramic package technology, whereby a semiconductor die (the ASIC die in this case) is mounted in a "sandwich" of ceramic "circuit boards", with pins or other connection points on at least one surface, which accomplish whatever bond-finger routing and/or power supply pin/plane layout is necessary to meet the user's needs (the internal leads o traces which connect (route) the external connection points of the package to a semiconductor die mounted therein are commonly referred to as "bond-fingers"). These non-standard packages can be very costly, however, and may require time and effort which is incompatible with the rapid-turnaround ASIC production environment, thereby costing the user both time and money.

Lower-cost "standard" packages include both ceramic devices and plastic devices. While plastic devices are not typically "sandwiched" into multi-layer "circuit boards" in quite the same fashion as ceramic packages, it is known in the prior art to provide plastic packages with several embedded layers of patterned conductive traces to accomplish effectively the same result.

Another factor complicating the ASIC marketplace is that users often want the same ASIC packaged in several different packages, for example, one package in a PLCC (plastic leaded chip carrier, a plastic package with 'J' shaped leads folded underneath on four sides of the package) format, another in a PQFP (plastic quad flat pack, a plastic package with leads extending out in a planar configuration from four sides of the package), and yet another in a PGA (Pin Grid Array, package with an array of pins on a bottom surface) or BGA (Bump Grid Array, similar to PGA, but with reflowable solder bumps instead of pins).

One simple response to the power-supply pin problem is to use a standard package and simply connect power supplies to a number of different pins. A problem with this approach is that high-speed designs require power supply "planes" within the package, and the standard "bond-fingers" to which ordinary pins are connected do not provide equivalent performance to a power supply plane.

In response to these needs, U.S. Pat. No. 4,972,253, entitled "PROGRAMMABLE CERAMIC HIGH PERFORMANCE CUSTOM PACKAGE", issued on Nov. 20, 1990 to Palino and Fisher, discloses a "programmable" multi-layer ceramic semiconductor package wherein all layers are standardized except for a "via layer" which is provides user-specific signal routing. This layer is produced prior to assembly of the package. The final package is then assembled with the customized via layer, which can connect pins to signals on the semiconductor die or to power supply connections on the semiconductor die via a power plane arrangement. Using this approach, it is possible to visualize an inventory of standard devices awaiting customization with a special "via layer". This programmable package offers significant advantages over the prior-art technique of developing full custom packages for each customer, but it still requires custom design of one layer and custom assembly, both of which require a specialized facility, design tools, and manufacturing equipment.

Another problem with this type of programmable package is that in order to properly anticipate all of the users' needs, it may be necessary to provide a number of power planes in excess of those which would ordinarily be necessary, increasing the complexity and cost of the package.

Evidently, then, there is a need for a standard package with programmable configuration, which can be customized using tools commonly available to ASIC users.

DISCLOSURE OF THE INVENTION

It is therefore an object of the present invention to provide a programmable semiconductor package which allows for user reconfiguration of external connection points of the package using tools generally available to ASIC users.

It is a further object of the present invention to provide a programmable semiconductor package which permits user reconfiguration of an external connection point of the package as either a "standard" I/O connection or as a power supply connection.

It is a further object of the present invention to provide a semiconductor package having only a minimal set of power supply planes to which one or more power plane or bus structures can be added.

According to the invention, a semiconductor package is provided having a plurality of embedded patterned conductive layers. At least one layer is patterned into "bond-fingers" which route signals from a connection area in the general vicinity of a semiconductor die (in the interior of the package) to external connection points on the exterior of the package. At least one conductive layer is disposed above or below the bond-fingers. The package is provided with programming holes extending from the exterior of the package into the interior of the package, such that these holes intercept at least one conductive layer, and provide external access to the conductive material of the intercepted layers.

In one embodiment of the invention, the programming is accomplished by placing solder-coated pins into selected programming holes, then heating the entire assembly until the solder re-flows, establishing electrical contact with the exposed conductive material of any conductive layers intercepted by those holes.

In another embodiment of the invention, the programming is accomplished in a similar manner, but using conductive epoxy rather than solder, such that the conductive epoxy provides the electrical contact with the intercepted conductive layers.

In another embodiment of the invention, the programming is accomplished by plating, screening, or otherwise depositing electrically conductive material into selected programming holes such that contact is made with the intercepted layers.

In another embodiment of the invention, "vias" are provided which terminate on one end in conductive lands on an exterior surface of the device, and which terminate on the other end at one of the conductive layers. Jumpers may then be connected across selected conductive lands to accomplish the programming of the package.

In another embodiment of the invention, a programming "bus bar" has a plurality of pins which simultaneously programs and cross-connects a like plurality of programming holes.

In another embodiment of the invention, an auxilliary power plane is provided having a plurality of pins which simultaneously programs and cross-connects a like plurality of programming holes.

In another embodiment of the invention, an insulating cover is further provided to cover the programmed area.

Other objects, features and advantages of the invention will become apparent in light of the following description thereof.

DETAILED DESCRIPTION OF THE INVENTION

Figure 1A:
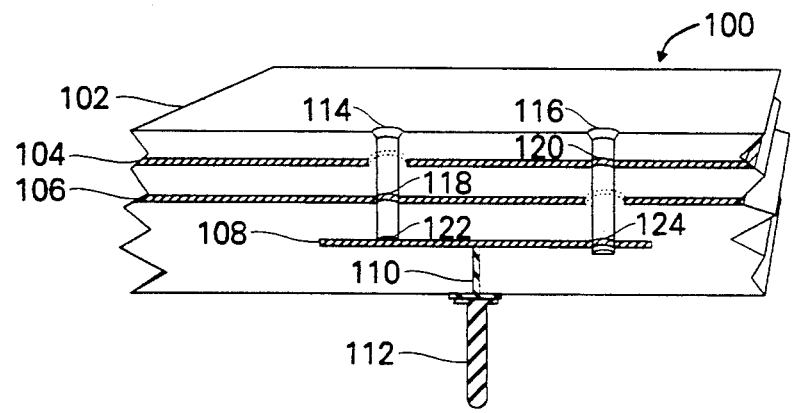
FIG. 1a is a cutaway view of a section of a semiconductor package according to the invention.

FIG. 1a shows a cutaway view of a section 100 of a programmable semiconductor package according to the present invention. A multi-layer body 102 has patterned conductive layers 104, and 106. The package 100 may be either ceramic or plastic. A bond-finger 108 belongs to a third patterned conductive layer. In this embodiment, layers 104 and 106 are "plane" structures, which carry power and ground, respectively. Bond-finger 108 connects to a pin 112 on the exterior of the body 102 by a conductive via 110. Not shown (to reduce illustrative clutter), is the continuation of bond-finger 108 to a point where it forms a termination point which may be connected to a semiconductor die.

Programming holes 114 and 116 extend from a surface of the body 102 into the interior such that they pass through layers 104, 106, and intercept bond-finger 108. Layer 104 is patterned such that it "avoids" hole 114, and layer 106 is patterned such that it "avoids" hole 116. Hole 114, however exposes a portion of the conductive material of layer 106 and of bond-finger 108, forming contacts 118 and 122, respectively. Hole 116 exposes a portion of the conductive material of layer 104 and of bond-finger 108, forming contacts 120 and 124, respectively. These programming holes 114 and 116 may be programmed to cause contact to be made either between layer 106 and bond-finger 108, or between layer 104 and bond-finger 108.

There is a slight difference the method of exposure of bond-finger 108 by the two programming holes 114 and 116. Programming hole 114 exposes the conductive material of bond-finger 108 by extending its opening just until it reaches bond-finger 108, but does not penetrate it. In this form, the contact area 122 is at the bottom of hole 114. Programming hole 116, however, penetrates bond-finger 108, forming its contact area 124 with bond-finger 108 on the side wall of hole 116.

Figure 1B:
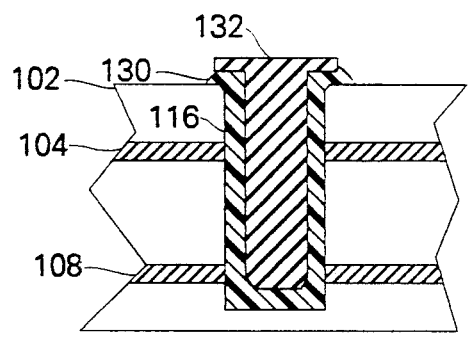
FIGS. 1b and 1c are cross-sectional views of a "programmed" programming hole according to the invention.
Figure 1C:
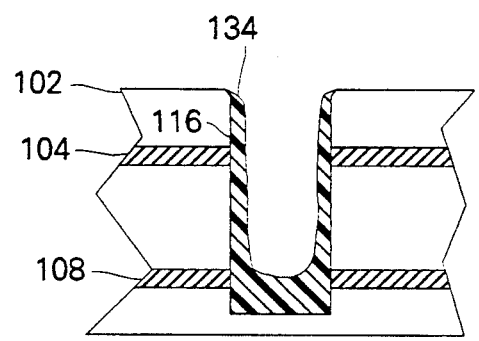

FIGS. 1b and 1c illustrate how a representative programming hole 116 may be "programmed"

FIG. 1b shows one method of programming hole 116 by a pin 132 and a conductive material 130. Typically, the pin 132 would be coated with conductive material 130 and inserted into hole 116 in a manner that causes conductive material 130 to form an electrical connection between bond-finger 108 and layer 104.

In one embodiment of the invention, conductive material 130 would be solder which would then be re-flowed by applying heat. In another embodiment, conductive material; 130 would be a conductive epoxy. The conductive epoxy approach is particularly well suited to used with plastic packages, where application of heat is less desirable.

FIG. 1c shows an alternate approach to programming whereby a conductive material 134 is simply deposited (by screening, plating, or other suitablemethod) into programming hole 116 such that it forms an electrical connection between bond-finger 108 and layer 104.

If neither hole (114 or 116) is "programmed", then no connections are made to bond-finger 108 from the power or ground planes, and pin 112 is a "normal" I/O pin, i.e., it simply connects a signal on a semiconductor die to the outside world. If hole 114 is "programmed", the bond-finger 108 is additionally connected to the ground plane (106), making it part of the ground distribution for the package. If hole 116 is "programmed", the bond-finger 108 is additionally connected to the power plane (104) making it part of the power distribution for the package. (Of course if both holes 114 and 116 are "programmed" then both connections are made, thus shorting the two planes together. This is normally not desirable). Many pins of this type may be provided on a package, providing a simple means for trading-off between the number of "signal" pins and "power" pins, without requiring a complete new package.

Figure 1D:
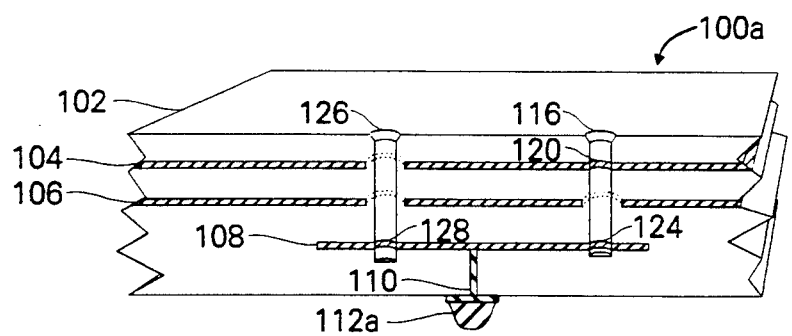
FIG. 1d is a cutaway view of an alternate embodiment of a semiconductor package according to the invention.

FIG. 1d shows an alternate embodiment 100a of a semiconductor package according to the present invention. This embodiment is similar to that of FIG. 1a, but programming hole 114 is replace with slightly different programming hole 126. In this embodiment, programming hole 126 penetrates bond-finger 108, forming a contact area 128 on the side wall of the hole 126. However, programming hole 126 is "avoided" by both layers 104 and 106, forming no contact area therewith. As a result, programming hole 126 provides conductive access to bond-finger 108 without connecting it to anything else. This is useful for providing external auxiliary structures, as described hereinbelow with respect to FIG. 3.

It should be noted, that the pin 112 of FIG. 1a has been replaced with a solder bump 112a (ball bump) in FIG. 1d. This type of electrical interconnection is becoming increasingly popular for certain applications. It is within the scope of the present invention to provide external connections using pins, lands, solder bumps, or any other suitable external connection means.

Figure 2:
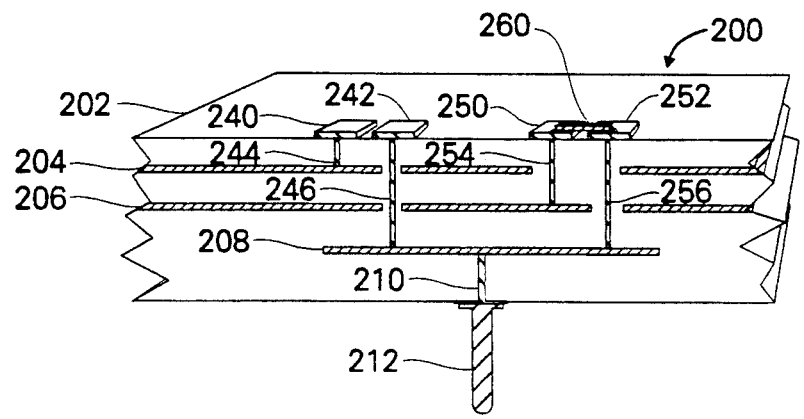
FIG. 2 is cutaway view another alternate embodiment of a semiconductor package according to the invention.

FIG. 2 is another cutaway view of another alternative embodiment of a programmable semiconductor package 200, according to the present invention. A plastic or ceramic multi-layer body 202 has embedded conductive layers 204, 206, and at least one patterned conductive layer forming a plurality of bond fingers, of which bond-finger 108 is representative. It is assumed that bond-finger 108 terminates at a die connection area. Bond-finger 208 is connected by an electrically conductive via 210 to an external pin 212. Electrically conductive vias 246 and 256 connect to and extend from bond-finger 108 to the surface of body 202, where they terminate in conductive lands (pads) 242 and 252, respectively. A via 244 connects layer 204 to a pad 240 on the surface of body 202, and a via 254 connects layer 206 to a pad 250 on the surface of body 202. Effectively, then, the programming holes 114 and 116 with respect to FIG. 1a are replaced pairs of conductive pads in this embodiment. "Programming" of the semiconductor package is accomplished by connecting (preferably soldering) jumpers across selected pairs of pads, thereby establishing electrical contact therebetween. Such a jumper 260 is shown connecting pads 250 and 252, effectively connecting bond-finger 208 to layer 206.

Figure 3:
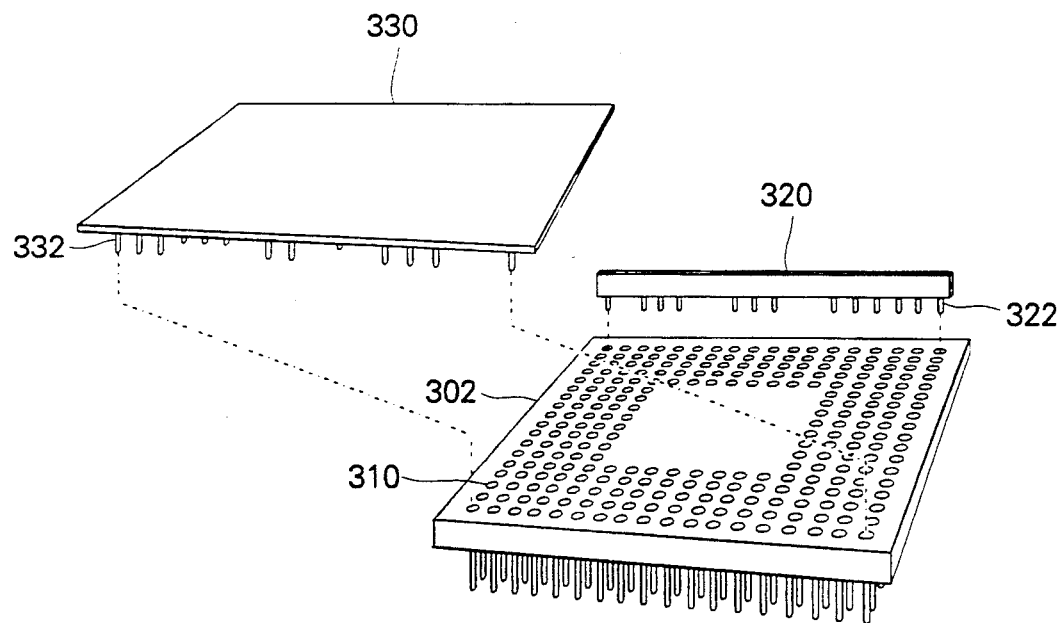
FIG. 3 is a view of a semiconductor package showing an auxiliary plane and a bus bar, according to the invention.

FIG. 3 shows a semiconductor package 302 according to the invention which has a plurality of programming holes 310. Two auxiliary structures are shown: an auxiliary bus-bar 320 and an auxiliary plane 330. Auxiliary bus-bar has a plurality of pins 322, which are coated with a conductive material as described with respect to FIG. 1b, in this case a conductive epoxy. Bus-bar 320 is constructed such that all of the pins 322 are electrically conductive to one another. The pins of 320 are then placed into selected ones of holes 310 thereby electrically connecting them together. Assuming that all of the holes into which pins 322 are inserted are similar to programming hole 126 with respect to FIG. 1d, wherein no connection is made other than to a bond-finger, then bus-bar 322 provides an external power bus (or ground bus, or a higher current bus for any purpose).

If an extra power supply distribution plane is required, then a structure such as auxiliary plane 330 may be employed. Auxiliary plane 330 has a plurality of pins 332, similar to pins 322, which are all electrically conductive to one another and which are coated with a conductive material (in this case a conductive epoxy). Auxiliary plane 330 is places such that pins 332 are inserted into selected ones of holes 310, thereby electrically connecting them together. Assuming again that all of the holes into which pins 332 are inserted are similar to hole 126 with respect to FIG. 1b, where no connections are made other than to a bond-finger, then auxiliary plane 330 may be used to provide a power distribution plane for a power supply which has no distribution plane in the package 302.

Figure 4:
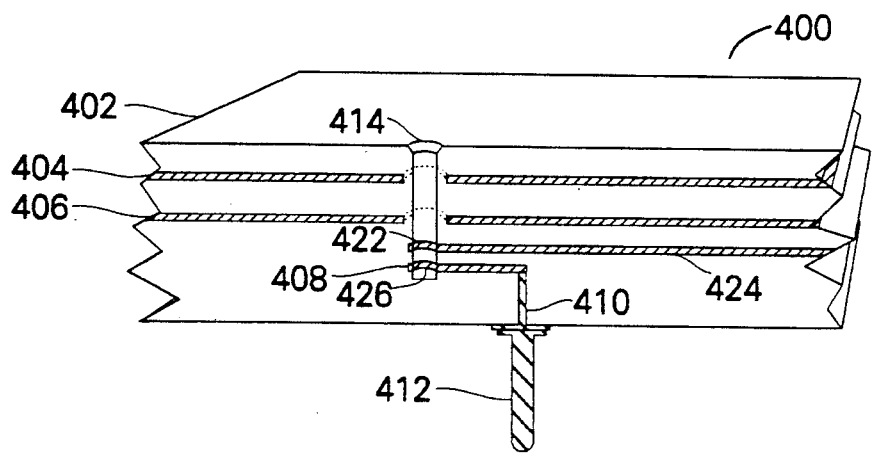
FIG. 4 is a cutaway view of another alternate embodiment of a semiconductor package according to the invention.

FIG. 4 shows cutaway view of another alternative embodiment of a programmable semiconductor package 400 according to the invention, where a programming hole 414 is used to "program" a connection between a signal trace 424 and a pin 412. According to the FIG., a multi-layer body 404 has conductive layers 404 and 406, signal traces in a first layer (presumably from a semiconductor die) of which 424 is representative, and pins, of which pin 412 is representative. Pin 412 is connected to a signal trace 480 in a second layer by a conductive via 410. Programming hole 414 is "avoided" by layers 404 and 406, forming no contact therewith, but penetrating and forming contacts 422 and 426 with signal traces 424 and 426, respectively.

This type of hole permits selective connection of pins to traces. If, for example, a signal trace connecting to a pin formed contacts with a plurality of holes, each of which formed one other contact with a different signal trace or with a power plane, then a sort of cross-point programming matrix results, permitting "patch-bay" type programming of the external connections to a semiconductor package.

Figure 5:
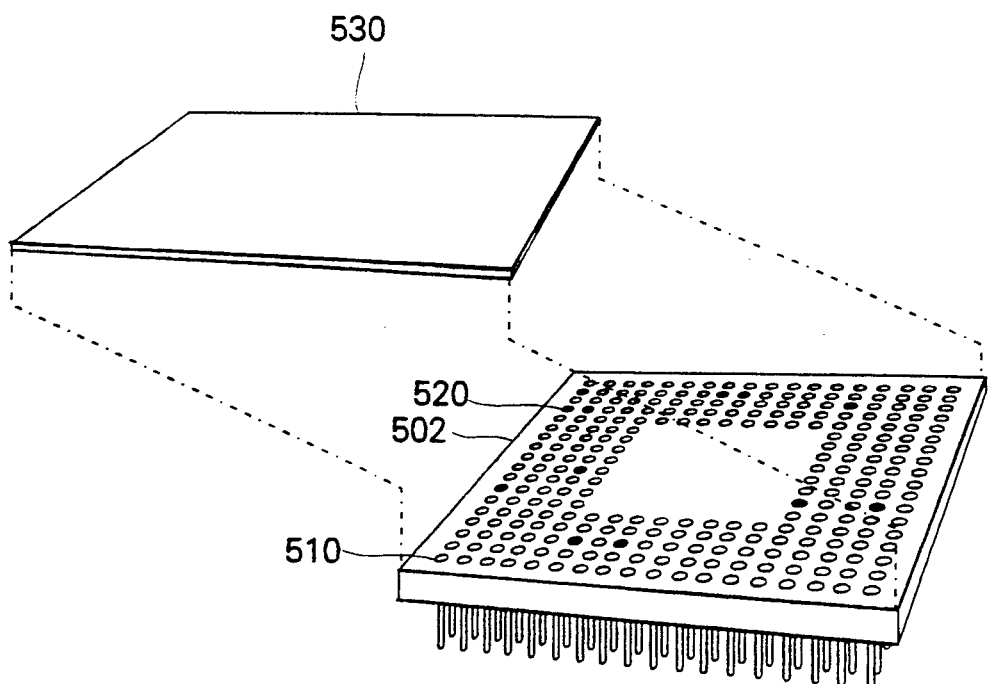
FIG. 5 is a view of a programmed semiconductor package, according to the invention, where an insulating cover is additionally provided.

FIG. 5 shows a programmable semiconductor package 502, having a plurality of programming holes 510, some of which (e.g., 520) are programmed. A protective insulating cover 530 is shown which may be disposed over the programming holes 510, thereby protecting those holes which have not been programmed and/or preventing shorts between those that have. Alternatively, a protective cover 530 could be formed by coating the top surface of package 502 after programming with a non-conductive epoxy, a silicone sealant, or other suitable material.

It should be noted that any of the aforementioned embodiments may be used alone or in combination with others to provide maximum flexibility.

The techniques described hereinabove permit creation of a flexible, programmable semiconductor package which permits user reconfiguration of the pins. In some embodiments, simply be for the purpose of designating power supply pins. In other embodiments, full-blown patch-bay programming of the pinout might be accomplished. Not all pins of any given package need be programmable, permitting an optimal mix of fixed and variable function, as necessary for a particular application environment.

What is claimed is:

1. A configurable semiconductor package allowing a user to direct signals from a die within the package to selected terminals disposed on an exterior surface of the package, comprising:

a multi-layer package body having alternating at least one layer each of conductive traces and insulating material, and having terminals disposed on a first exterior surface of the package body;

wherein:

a first of the alternating layers is a layer of conductive traces within the package body, and has points at the ends of the first conductive traces for connecting to a semiconductor die mounted in an opening within the package body;

a second of the alternating layers is a layer of second conductive traces within the package body;

a third of the alternating layers is a layer of insulating material within the package body separating the first layer from the second layer;

further comprising:

conductive vias disposed within the package body and extending between the second conductive traces and the terminals;

holes extending from a second exterior surface of the package, opposite the first exterior surface of the package body, extending into the package body, and communicating with corresponding ones of the first and second conductive traces of the first and second layer, respectively;

means, disposed in the holes, within the package body, for configurably connecting selected ones of the first conductive traces to selected ones of the second conductive traces in order that a user may direct signals between a selected one of the die-connecting points and a selected one of the package terminals.

2. A package, according to claim 1, wherein:
the means for configurably connecting a selected one of the first conductive traces to a selected corresponding one of the second conductive traces is a pin insertable into the hole.

3. A package, according to claim 1, wherein:
the means for configurably connecting a selected one of the first conductive traces to a selected corresponding one of the second conductive traces is a pin insertable into the hole and coated with a conductive material.

4. A package, according to claim 3, wherein:
the conductive material is solder.

5. A package, according to claim 3, wherein:
the conductive material is epoxy.

6. A package, according to claim 1, wherein:
the means for configurably connecting a selected one of the first conductive traces to a selected corresponding one of the second conductive traces is a conductive material deposited into the hole.

7. A package, according to claim 6, wherein:
the conductive material is solder.

8. A package, according to claim 6, wherein:
the conductive material is epoxy.

9. A package, according to claim 1, wherein:
the means for configurably connecting selected ones of the first conductive traces to selected corresponding selected one of the second conductive traces is a bus bar having a plurality of pins insertable into a like plurality of holes.

10. A package, according to claim 9, wherein:
the pins are coated with a conductive material.

11. A package, according to claim 10, wherein:
the conductive material is solder.

12. A package, according to claim 10, wherein:
the conductive material is epoxy.

* * * * *